(12) United States Patent
Taheri (10) Patent No.: US 7,202,696 B1
(45) Date of Patent: Apr. 10, 2007

(54) CIRCUIT FOR TEMPERATURE AND BETA COMPENSATION

(75) Inventor: Babak Taheri, San Francisco, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 125 days.

(21) Appl. No.: 10/934,290

(22) Filed: Sep. 3, 2004

Related U.S. Application Data (60) Provisional application No. 60/506,467, filed on Sep. 26, 2003.

(51) Int. Cl.
*H03K 19/003* (2006.01)

(52) U.S. Cl. .......................... 326/32; 326/126
(58) Field of Classification Search ................ 326/115, 326/126, 127, 32
See application file for complete search history.

(56) References Cited

U.S. PATENT DOCUMENTS

| | | | | |
|---|---|---|---|---|
| 4,533,842 | A * | 8/1985 | Yang et al. .................... | 326/78 |
| 5,072,136 | A * | 12/1991 | Naghshineh ................. | 326/126 |
| 5,124,580 | A * | 6/1992 | Matthews et al. .......... | 326/110 |
| 5,994,923 | A | 11/1999 | Navabi | |
| 6,104,231 | A * | 8/2000 | Kirkpatrick, II ............ | 327/513 |
| 6,104,232 | A * | 8/2000 | Filip .......................... | 327/513 |
| 6,123,107 | A | 9/2000 | Selser et al. | |
| 6,237,394 | B1 | 5/2001 | Harris et al. | |
| 6,297,685 | B1 * | 10/2001 | Ewen et al. ................. | 327/513 |
| 6,366,159 | B1 | 4/2002 | Taheri | |
| 6,434,420 | B1 | 8/2002 | Taheri | |
| 6,434,421 | B1 | 8/2002 | Taheri | |
| 6,438,413 | B1 | 8/2002 | Taheri | |
| 6,445,240 | B1 | 9/2002 | Taheri | |
| 6,608,515 | B2 | 8/2003 | Taheri | |

OTHER PUBLICATIONS

Cypress Advance Information, FastEdge™ Series CS6160ATT, 1 of 2:4 Differential Fanout Buffer, Document #: 38-07551 Rev.**, Revised Jun. 4, 2003.
Cypress Preliminary, FastEdge™ Series CY2DP314, 1 of 2:4 Differential Fanout Buffer, Document #:38-07550 Rev. *B, Revised Feb. 17, 2004.
Cypress, FastEdge™ Series CY2DP3120, 1:20 Differential Fanout Buffer, Document #:38-07514 Rev. *B, Revised May 26, 2004.

(Continued)

*Primary Examiner*—James H. Cho
(74) *Attorney, Agent, or Firm*—Blakely, Sokoloff, Taylor & Zafman LLP (57) ABSTRACT

A compensation circuit is disclosed. The compensation circuit includes a driver stage having an output, a differential output device including a base coupled to the output of the driver stage, and a feedback block coupled to a first emitter of the differential output device. The differential output device includes a second emitter to provide a differential output, and the feedback block generates a feedback signal to adjust the differential output. The first emitter comprises a replicating transistor, and is proximate to the second emitter of the differential output device. By keeping the replicating emitter near the differential output device, the variances of temperature and process over the semiconductor die do not affect the performance of the compensation circuit. The compensation circuit may also compensate for variations in common-emitter current gain.

33 Claims, 7 Drawing Sheets

OTHER PUBLICATIONS

Cypress, FastEdge™ Series CY2PP3220, Dual 1:10 Differential Fanout Buffer, Document #:38-07513 Rev. *B, Revised May 26, 2004.

Cypress Advance Information, CY2XP304, High-Frequency Programmable PECL Clock Generation Module, Document #:38-07589 Rev. **, Revised Nov. 25, 2003.

Cypress, FastEdge™ Series CY2PP3210, Dual 1:5 Differential Fanout Buffer, Document #:38-07508 Rev. *B, Revised May 26, 2004.

Cypress Preliminary, FastEdge™ Series CY2PP326, 2×2 Clock and Data Switch Buffer, Document #:38-07506 Rev. *B, Revised Sep. 8, 2003.

Cypress, FastEdge™ Series CY2PP318, 1 of 2:8 Differential Fanout Buffer, Document #:38-07501 Rev. *D, Revised May 26, 2004.

* cited by examiner

CIRCUIT FOR TEMPERATURE AND BETA COMPENSATION

RELATED APPLICATION

This application claims the benefit of U.S. Provisional Application No. 60/506,467, filed Sep. 26, 2003.

TECHNICAL FIELD

Embodiments of the invention pertain to an electronic circuit, and specifically a circuit for applying a compensating current for temperature and Beta variations.

BACKGROUND

Emitter-coupled logic (ECL) involves a bipolar form of logic, whereby the bipolar transistors are arranged so that they do not operate at saturation. In recent designs, ECL is often used with a positive power supply. Positive ECL designs are typically referred to as positive- or psuedo-ECL (PECL). PECL can be advantageous as clock speeds increase. For example, PECL can be employed within an output driver circuit to produce high speed output signals. The high speed signals are well suited as a clocking source or as a serial link if applied in complementary, or differential form.

Differential binary signals are defined as the difference between two outputs at dissimilar logic values. For example, one output may have a logical value of 1, while the other, differential output, has the opposite logical value of 0. The differential outputs are typically driven by differential drive transistors. The performance of the drive transistors can vary due to temperature and process variations. For example, an increase in operating temperature will decrease the base-to-emitter forward bias voltage ($V_{BE}$) of the drive transistors. It is generally accepted that for every 1° Celsius (C.) increase in operating temperature, the forward bias voltage $V_{BE}$ decreases approximately 2 millivolts (mV).

Figure 1:
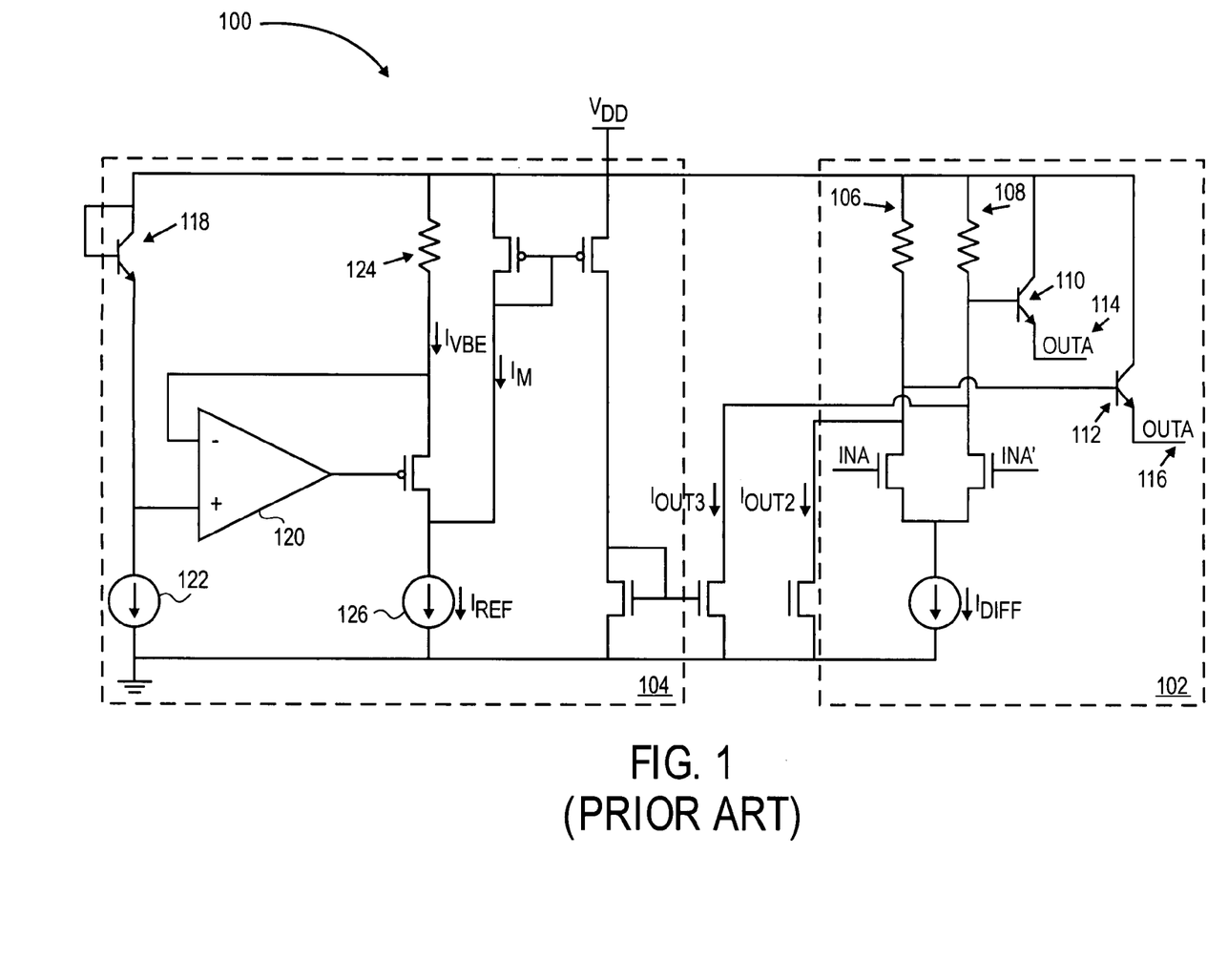
FIG. 1 shows a conventional circuit for compensating for temperature variations.

FIG. 1 shows a conventional circuit for compensating for temperature variations. The circuit 100 includes two subcircuits 102 and 104. The subcircuit 102 includes differential drive stages 106 and 108, differential output transistors (devices) 110 and 112, and differential outputs 114 and 116. The subcircuit 104 corrects for the temperature variation in the forward bias voltage $V_{BE}$. The subcircuit 104 includes a sensing (or replicating) device 118 and an operational amplifier 120.

The sensing device 118 is a replicating transistor. The correcting subcircuit 104 operates on the principle that the forward bias voltage $V_{BE}$ for the sensing device 118 will be the same as the forward bias voltage $V_{BE}$ for the differential output transistors 110 and 112. A current source 122 draws a constant current across the replicating transistor 118 at all times. A replicated voltage across the resistor 124 corresponds to the replicated voltage across the transistor 118. The current $I_{VBE}$ is proportional to the voltage $V_{BE}$. A current source 126 generates a reference current $I_{REF}$ and has a voltage $V_{REF}$ across it. The current $I_M$ is non-zero when $V_{BE} < V_{REF}$. $I_M$ is mirrored such that $I_{OUT2}$ and $I_{OUT3}$ are proportional to $I_M$, and hence a function of $V_{BE}$. $I_{OUT2}$ and $I_{OUT3}$ are compensating currents applied to the drive stages 106 and 108.

The subcircuit 104 monitors the base currents of the transistors 110 and 112. When these currents exceed the predetermined threshold of the current $I_{REF}$, the compensating currents $I_{OUT2}$ and $I_{OUT3}$ sink current from the drive stages 106 and 108. This effectively increases the output voltages at the outputs 114 and 116.

In an integrated circuit (IC), the transistors 110, 112, and 118 are formed on the same wafer, and theoretically subject to the same temperature and process variations. However, the sensing device 118 is so distant from the differential output transistors 110 and 112 that the sensing device 118 may not exhibit the same forward bias voltage as the two differential output transistors 110 and 112. This may result in some inaccuracy in the compensating current. In addition, the transistor 118 is typically a much smaller device in area than the output transistors 110 and 112, hence there is significant current density (a potential source of error) difference between the correcting device and the output devices.

The common-emitter current gain, or beta, of a transistor, is a measure of the amount of current gained between the collector and the base of the transistor. Beta typically varies between transistors, even if they are manufactured using the same techniques. Therefore, two otherwise identical transistors in two otherwise identical circuits may have a different common-emitter current gain, thereby affecting the characteristics of the circuit.

BRIEF DESCRIPTION OF THE DRAWINGS

One or more embodiments of the present invention are illustrated by way of example and not limitation in the figures of the accompanying drawings, in which like references indicate similar elements and in which.

DETAILED DESCRIPTION

Described herein is a circuit for temperature and beta compensation. Note that in this description, references to "one embodiment" or "an embodiment" mean that the feature being referred to is included in at least one embodiment of the present invention. Further, separate references to "one embodiment" or "an embodiment" in this description do not necessarily refer to the same embodiment; however, such embodiments are also not mutually exclusive unless so stated, and except as will be readily apparent to those skilled in the art from the description. For example, a feature, structure, act, etc. described in one embodiment may also be included in other embodiments. Thus, the present invention can include a variety of combinations and/or integrations of the embodiments described herein.

According to an embodiment of the invention, a compensation circuit is disclosed. The compensation circuit includes a driver stage having an output, a differential output device including a base coupled to the output of the driver stage and a first emitter, a sensing device including a second emitter disposed locally to the differential output device, and a feedback circuit coupled to the second emitter of the sensing device. The first emitter of the differential output device provides a differential output, and the feedback circuit generates a feedback signal to adjust the differential output. By keeping the sensing device near the differential output device, the variances of temperature and process over the semiconductor die have less affect on the performance of the compensation circuit.

According to another embodiment of the invention, the compensation circuit is also able to adjust for variances in common-emitter current gain (beta). To accomplish this, the feedback circuit includes a first resistor having a first resistance coupled to a second base of the sensing device, and a second resister having a second resistance coupled to the second emitter of the sensing device. The value of beta can then be determined using the first resistance, the second resistance, a collector voltage of the differential output device, and a high voltage of the compensation circuit. By compensating for variances in beta, the circuit that is being compensated will have better performance.

The compensation circuits described herein may be used in a variety of different circuits. For example, the compensation circuits may be integrated into a bandgap or input/output (I/O) circuit.

Figure 2:
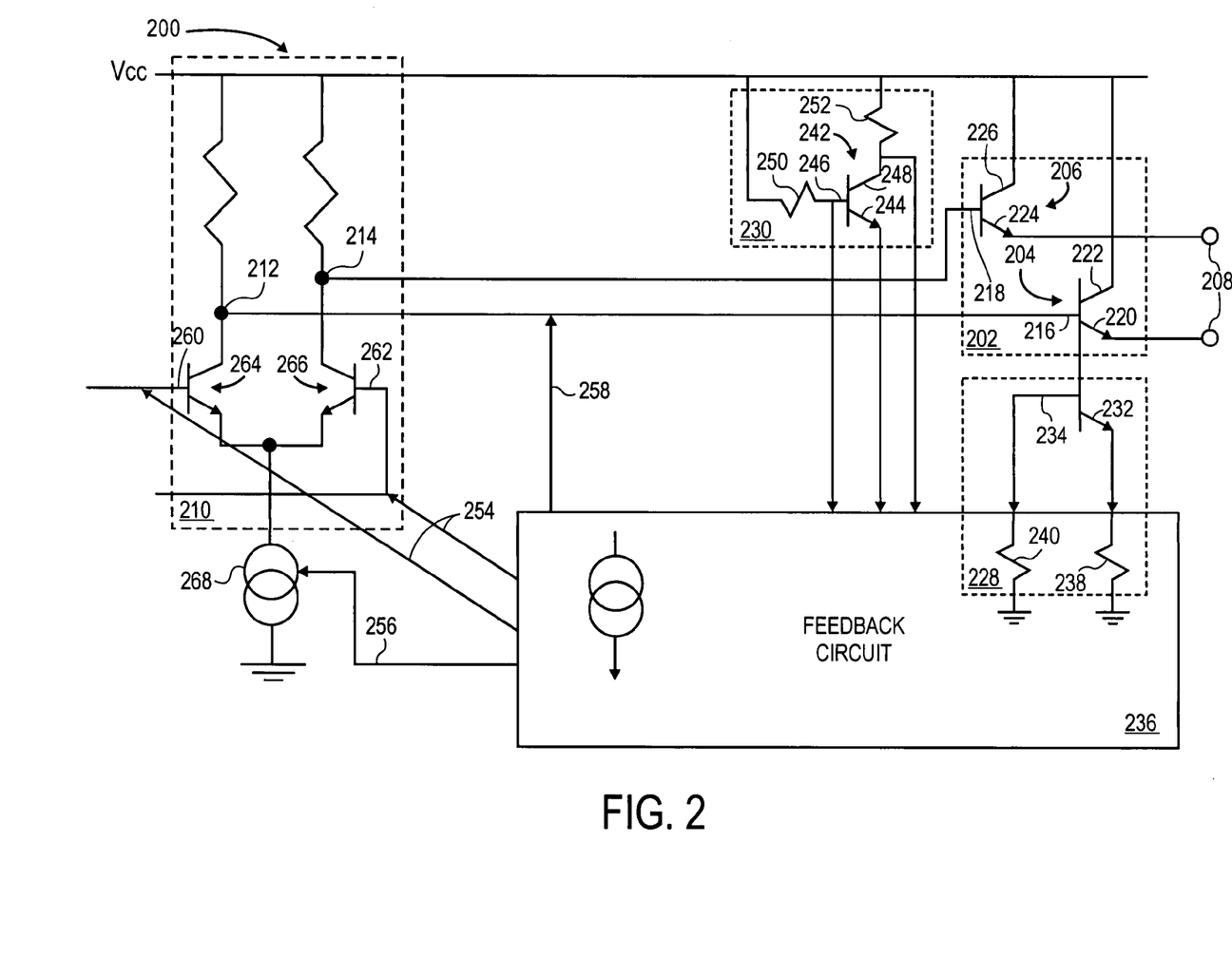
FIG. 2 illustrates embodiments of a compensation circuit.

FIG. 2 illustrates a first and second embodiment of a compensation circuit 200. The compensation stage circuit 200 shows two embodiments of the current invention that may be used individually. A differential output device 202 includes two transistors 204 and 206 to provide a differential output 208. The transistor 204 may be a dual emitter transistor when used with the first embodiment, and may be a single emitter transistor when used with the second embodiment; the same holds true for the transistor 206. The differential output device is driven by a driver stage 210. The driver stage 210 that includes two outputs 212 and 214 coupled to the bases 216 and 218 of the two transistors 204 and 206, respectively. The transistor 204 also includes an emitter 220 coupled to the differential output 208, and a collector 222 coupled to the high voltage ($V_{cc}$) of the compensation stage circuit 200. The transistor 206 includes an emitter 224 coupled to the differential output 208, and a collector 226 coupled to $V_{cc}$.

The two embodiments shown in FIG. 2 show two different sensing devices 228 and 230. According to the first embodiment, the sensing device 228 comprises a second emitter 232 and a second base 234 of the transistor 204, where the transistor 204 is a dual-emitter transistor. The second emitter 232 and second base 234 are coupled to a feedback circuit 236. A resistor 238 is coupled to the second emitter 232, and a resistor 240 is coupled to the second base 234. Each resistor 238 and 240 has a resistance chosen to calculate a value for beta, as will be explained below.

According to the second embodiment, the sensing device 230 includes a transistor 242 having an emitter 244, a base 246, and a collector 248, which are coupled to the feedback circuit 236. The base 246 is coupled to a resistor 250, and the collector 248 is coupled to a resistor 252. Each resistor 250 and 252 has a resistance chosen to calculate a value for beta, as will be explained below.

The second embodiment of the invention may be used where dual emitter transistors cannot be used because of the processing technology chosen. If the second embodiment of the invention is used, the sensing device 230 can still be located immediately adjacent the differential output device 202.

Each of the sensing devices 228 and 230 is disposed locally to the differential output device 202. The emitters 232 and 244 of the sensing devices 228 and 230, respectively, replicate the output of the emitter 220 of the differential output device. This replicated output is inputted into the feedback circuit 236, and a feedback signal comprising a corrective current is applied to one of three nodes of the driver stage 210. The corrective current may include corrective currents for both temperature and beta variations.

Since the sensing devices 228 and 230 are replicating the output of the differential output device 202, the closer in proximity the sensing devices 228 and 230 are to the differential output device 202, the more accurate the feedback signal will be. As can be seen in FIG. 2, the sensing devices 228 and 230 are immediately adjacent the differential output device 202. In other words, there are no components or other devices physically located between the sensing devices 228 and 230 and the differential output device. According to one embodiment, the spatial distance between the sensing devices 228 and 230 and the output device 202 is within four times an emitter size of the differential output device 202. In the case of the sensing device 228, the emitter 232 is part of the transistor 204 which the sensing device 228 is replicating. This allows the replicating emitters 232 and 244 in the sensing devices 228 and 230 to experience the same process and temperature variations as the emitter 220 in the differential output device 202, thereby generating a more accurate feedback signal.

According to one embodiment of the invention, the sensing devices 228 and 230 and the differential output device 202 are formed in the same process well. This allows the current densities of the sensing devices 228 and 230 and the differential output device to be well matched, in turn improving the performance of the sensing devices 228 and 230.

The feedback circuit 236 accepts either the output of the base 234 and the emitter 232, or the output of the emitter 244, base 246, and collector 248 to calculate and apply a feedback signal comprising a compensating current. The compensating current may be applied at one of three nodes 254, 256, or 258. The function of the feedback circuit 236 is explained below.

As will be explained below, the compensating current can also be tailored to compensate for the common-emitter current gain, or beta. Beta can be calculated using the resistances of the resistors 238 and 240 or of the resistors 250 and 252. The voltage across the two resistors 238 and 240 or 250 and 252 can be used to determine beta for the device. The compensating current for beta variations can be added to the compensating current for temperature variations. The compensating current for temperature variations can be generated using a reference current as described above. The reference current may be generated using a current source in the feedback circuit 236. The sum of the compensating currents, or one of the compensating currents alone, may comprise the feedback signal.

The feedback signal generated by the feedback circuit 236 may be applied to the first node 254. The first node 254 may comprise two nodes at the bases 260 and 262 of the transistors 264 and 266 of the driver stage 210 if a dual driver stage is used. If a single driver stage is used, the feedback signal would be applied at the base of the single driver transistor of that stage. Applying the feedback signal at the first node 254 reduces the gain of the feedback signal and its effect on the parasitic paths are of the second order.

The feedback signal may also be applied at the second node 256, at a current source 268. Applying the feedback signal at the second node 256 changes the swing of the signal, but does not affect the frequency response for high frequency applications (i.e., there are fewer parasitics for the signal path).

Finally, the feedback signal can also be applied at the third node 258, at the output 212 between the driver stage 210 and the base 216 of the transistor 204. Applying the current at the third node 258 creates the most effect on parasitics in the signal, which may be critical in high frequency applications. However, if the application is not frequency critical, applying the feedback signal at the third node 258 may be simpler and less expensive.

Figure 3:
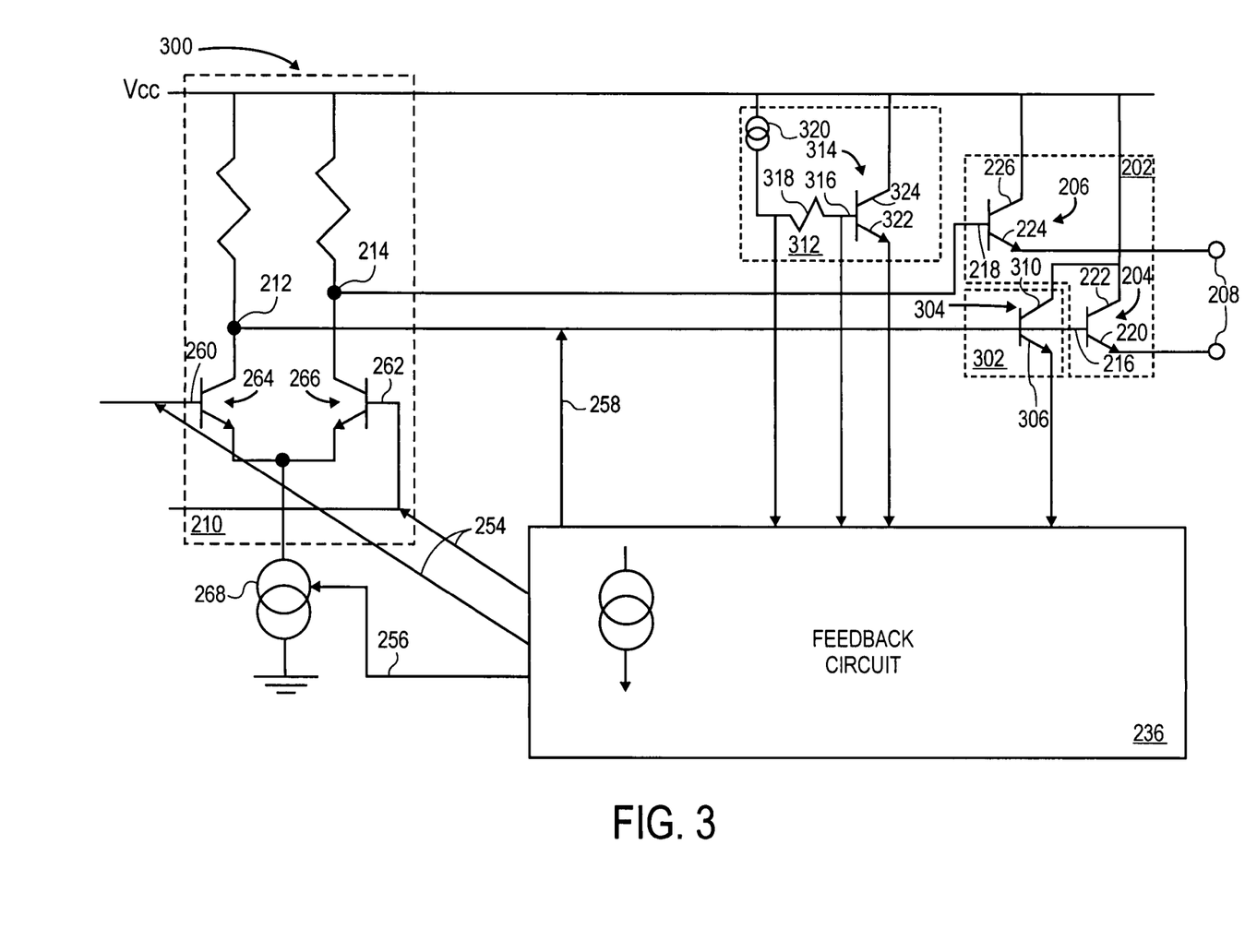
FIG. 3 illustrates other embodiments of a compensation circuit.

FIG. 3 illustrates a third and fourth embodiment of a compensation circuit 300. According to the third embodiment of the invention, a sensing device 302 comprising a replicating transistor 304 is located immediately adjacent to the differential output device 202. The emitter 306 of the replicating transistor 304 is coupled to the feedback circuit 236. The emitter 306 replicates the output of the emitter 220 of the transistor 204. The base 308 of the transistor 304 is coupled together with the base 216 of the transistor 204. The collector 310 of the transistor 304 is coupled to $V_{cc}$. As above, the feedback circuit 236 applies a feedback signal at one of the nodes 254, 256, or 258.

According to a fourth embodiment of the invention, a sensing device 312 is disposed locally to the differential output device 202. The sensing device 312 includes a replicating transistor 314 having a base 316 coupled to a resistor 318, which is coupled to a current source 320. The replicating transistor 314 also has an emitter 322 coupled to the feedback circuit 236 and a collector 324 connected to $V_{cc}$. The feedback circuit 236 may also measure the voltage across the resistor 318.

Figure 4:
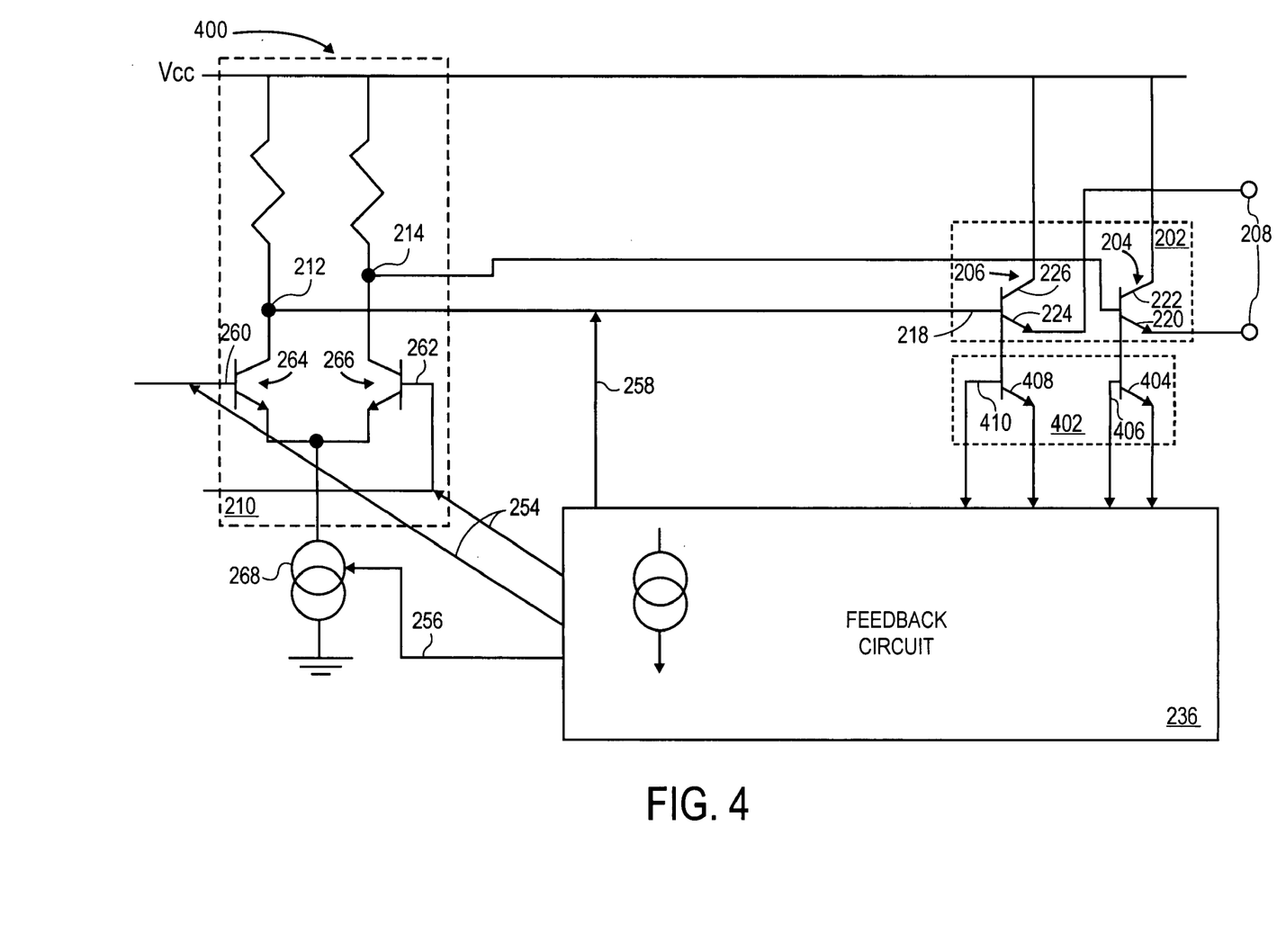
FIG. 4 illustrates an alternative embodiment of the compensation circuit.

FIG. 4 illustrates an alternate embodiment of the compensation circuit 200. The compensation circuit 400 shown in FIG. 4 includes two dual-emitter transistors. The transistors 204 and 206 of the differential output device 202 both include dual emitters according to this alternate embodiment. A sensing device 402 is positioned locally to the differential output device 202. The transistor 204 includes a second emitter 404 and a second base 406, which are coupled to the feedback circuit 236. The transistor 206 includes a second emitter 408 and a second base 410, which are coupled to the feedback circuit 236. The feedback circuit 236 can therefore compensate for variations in both transistors 204 and 206 to determine the feedback signal. This may provide a more accurate determination of the feedback signal, since both transistors 204 and 206 are providing an output.

The several compensating circuits described may also include a low capacitance node to allow increased operating frequency. Further, the orientation of either the replicating emitters or of the replicating transistors may be different, since the compensation circuits described herein are not sensitive to layout.

Figure 5:
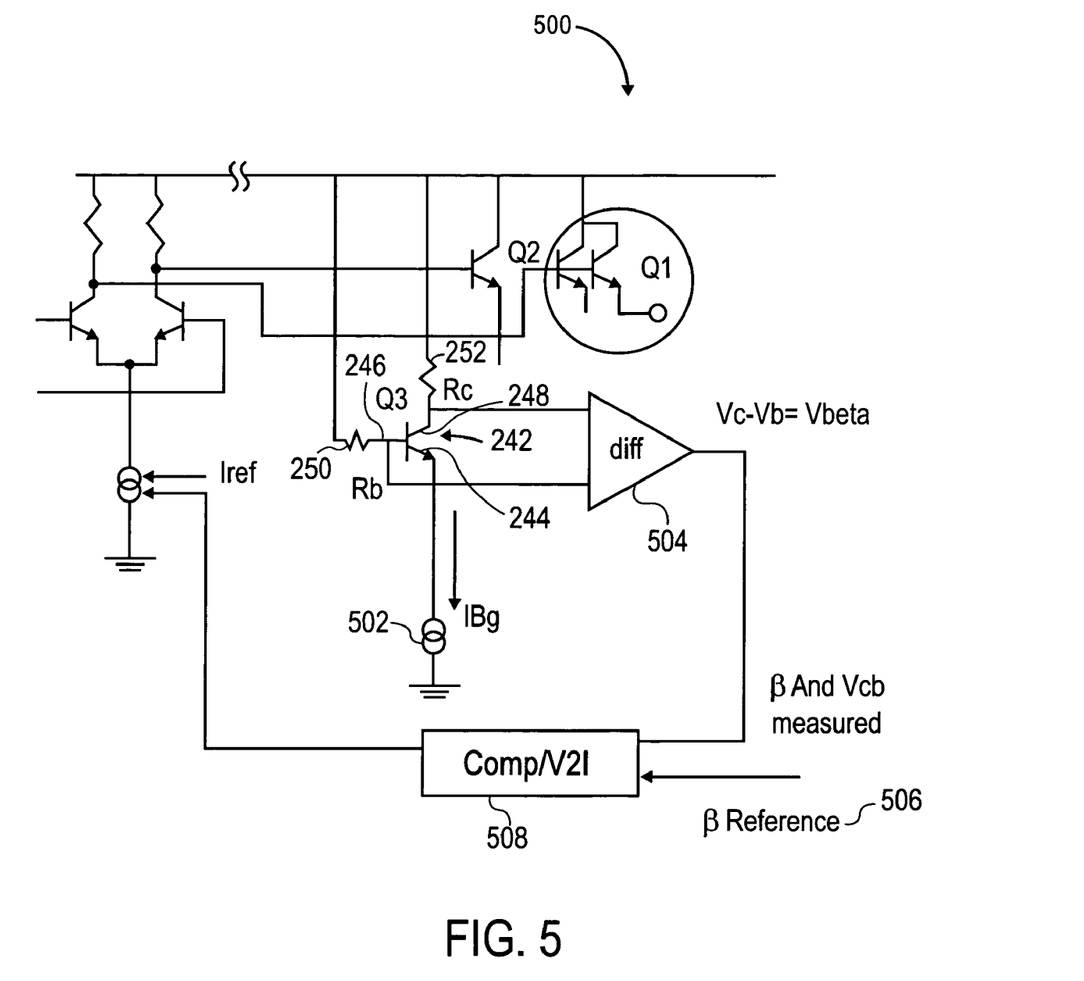
FIG. 5 illustrates one embodiment of a method for determining and compensating for beta variations.

The several compensating circuits described may also include a low capacitance node to allow increased operating frequency. Further, the orientation of either the replicating emitters or of the replicating transistors may be different, since the compensation circuits described herein are not sensitive to layout. Also, FIG. 5 illustrates one embodiment of a method for determining and compensating for beta variations. FIG. 5 is shown in terms of the second embodiment, described above. However, it is understood that the technique shown here can be used for all of the embodiments described. Where the technique diverges for the other embodiments, the differences will be explained.

Beta can be determined using the following equations. First, assume that the resistor 250 has a resistance of $R_b$ and that the resistor 252 has a resistance of $R_c$. Beta is given by the following equation:

$$\beta = \frac{I_c}{I_b} \quad (1)$$

The bandgap current generated by the current source 502, is equal to the current at the emitter 244, or $I_{bg}=I_e$. The current at the base 246 is given by the following equation:

$$I_b = \frac{V_{CC} - V_b}{R_b} \quad (2)$$

where $V_{cc}$ is the "high" value voltage, and $V_b$ is the voltage across the resistor 252. The current at the collector 248 is given by the following equation:

$$I_c = \frac{V_{cc} - V_c}{R_c} \quad (3)$$

where $V_c$ is the voltage across the resistor 252. Combining the three equations above gives an equation for beta:

$$\beta = \frac{(V_{cc} - V_c)R_b}{(V_{cc} - V_b)R_c} \quad (4)$$

Since the values of $V_{cc}$, $R_b$, and $R_c$ are known, beta can be determined by monitoring the values of $V_b$ and $V_c$. $V_b$ and $V_c$ are compared in a differentiator 504, which gives $V_{beta}$, where $V_{beta}=V_c-V_b$. According to one embodiment, the resistance Rb and Rc circuits should be carefully designed to reduce the incidence of miss-matched parameters. Such layout can be accomplished by well know techniques in the arts. A beta reference 506 is generated. The reference 506 is chosen as a typical beta value. Since the beta reference 506 is a current, $V_{beta}$ must be converted into a current to compare to the beta reference 506. The comparator 508 includes a resistor of known value so that a beta current value can be determined from the $V_{beta}$ using the resistor values of the resistors 250 and 252.

The comparator 508 compares the current of the $V_{beta}$ to the observed beta value. If the beta value is similar, the compensating current will be zero. For a slow beta (i.e., the observed beta is less than the beta reference 506), the compensating current is greater than zero (i.e., increase the tail current). For a fast beta (i.e., the observed beta is greater than the beta reference 506), the compensating current is less than zero.

The circuit 500 also compensates for temperature. The compensating current generated for the temperature variation is added to the compensating current generated for the beta variation to generate a feedback signal. The two are then applied at the same time. Compensating for temperature variation was described regarding the prior art.

The first and third embodiments described above are not shown including resistors coupled to the base and collectors of the transistors 204 and 206. As shown in FIG. 2, however, two resistors 238 and 240 are coupled to the second base 234 and the second emitter 232 of the transistor 204. Given that $I_e = I_b + I_c$, the collector voltage can be replaced in equation 1, resulting in the following equation for beta:

$$\beta = \frac{I_e - I_b}{I_b} \quad (5)$$

Substituting the known or determinable voltages and resistances gives the following equation for beta:

$$\beta = \frac{R_b V_e}{V_b R_e} - 1 \quad (6)$$

As above, the value for beta can be determined by measuring the voltages across the resistors, subtracting them to obtain $V_{beta}$, converting the voltage to a current, and comparing the current to a reference current.

Figure 6:
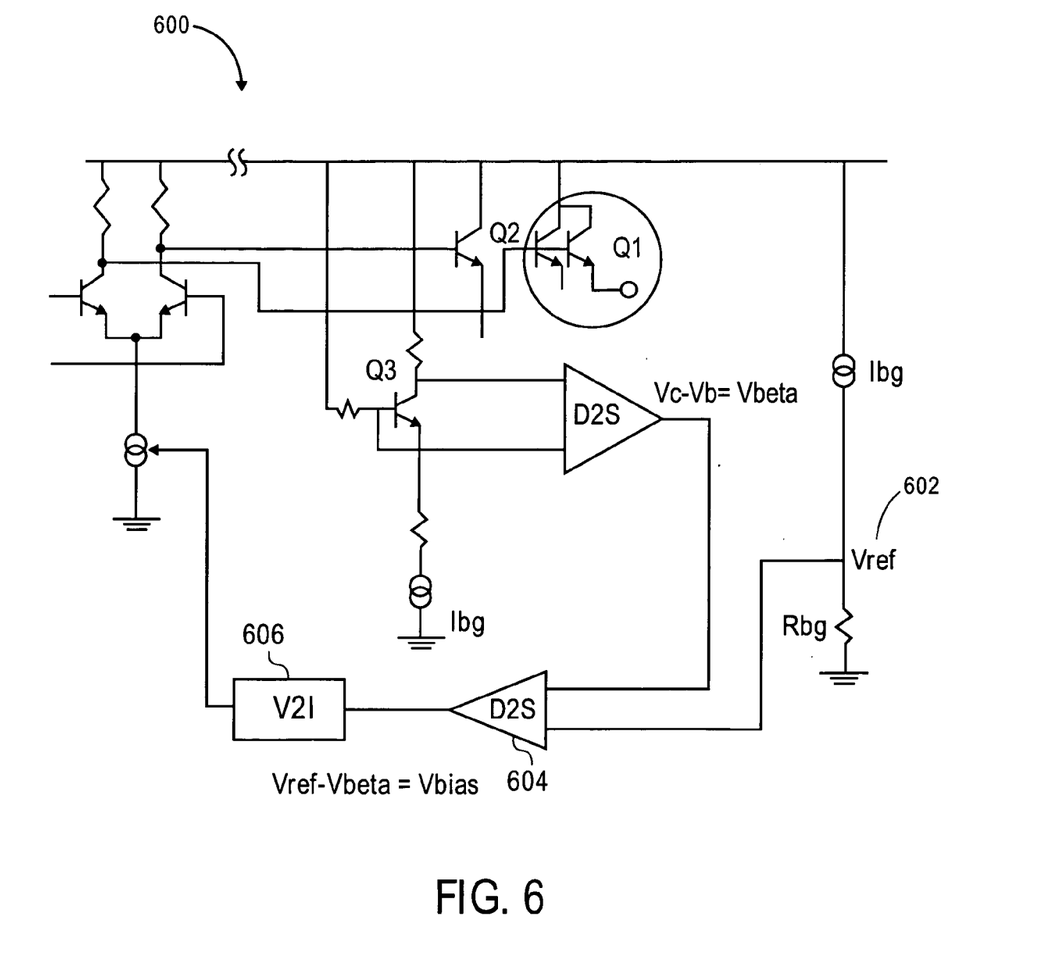
FIG. 6 illustrates an alternate technique for measuring and compensating for beta variations.

FIG. 6 illustrates an alternative embodiment of a method for measuring and compensating for beta variations. FIG. 6 shows a technique for using a reference voltage 602 rather than the reference current 506 of FIG. 5. Except for the details discussed herein, the circuit 600 is functionally the same as the circuit 500.

The beta voltage $V_{beta}$ is subtracted from the reference voltage $V_{ref}$ 602 in the differentiator 604. As with the reference 506 described above, the reference voltage $V_{ref}$ is chosen for a typical beta value. The difference between $V_{ref}$ and $V_{beta}$, $V_{bias}$ is outputted from the differentiator 604. The voltage $V_{bias}$ is then converted into an appropriate compensating current in the voltage to current converter 606. The compensating current is then applied to the drive circuit.

Figure 7:
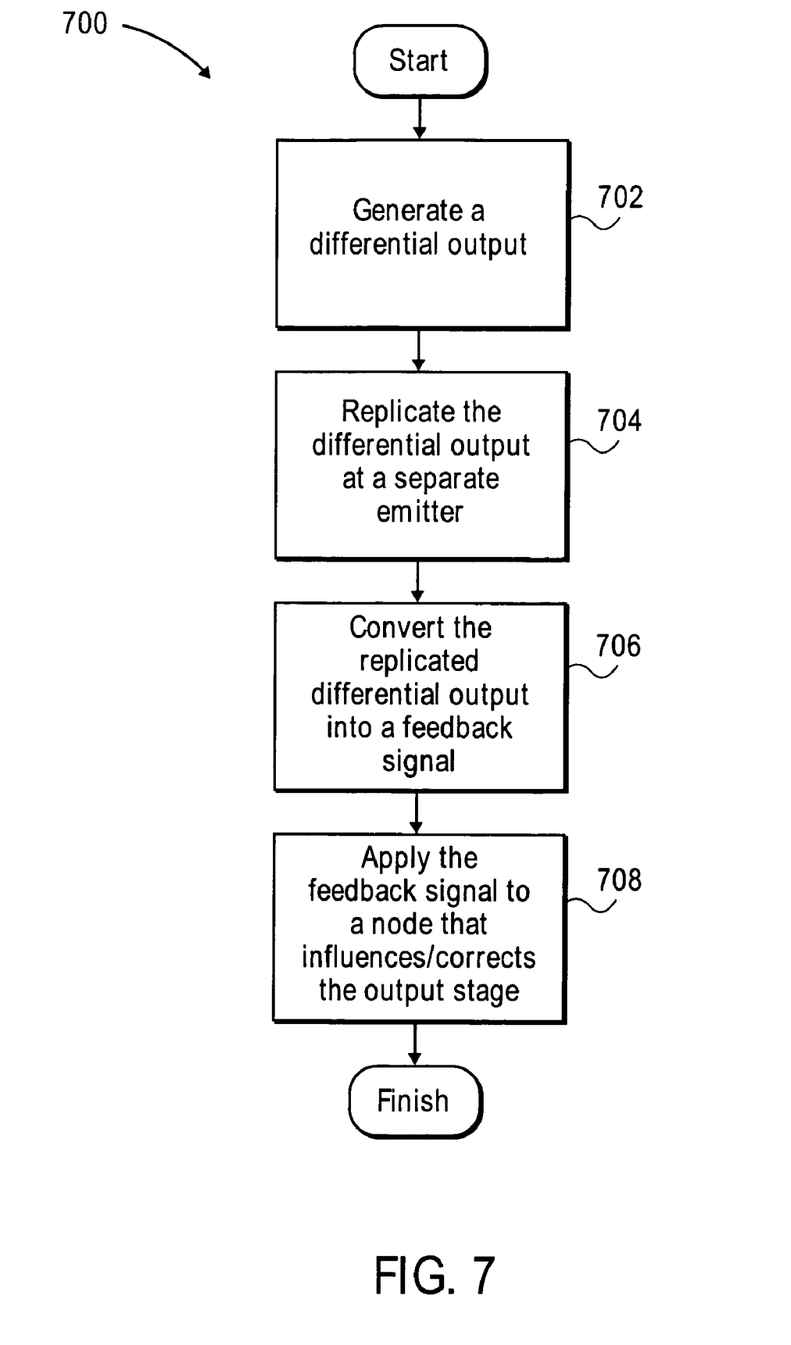
FIG. 7 is a flowchart describing a process for applying a compensating current according to an embodiment of the invention.

FIG. 7 is a flowchart describing a process for applying a compensating current according to an embodiment of the invention. The process 700 describes the general process for replicating and compensating for temperature and beta variations.

In block 702, a differential output is generated using a differential output device 202. It is understood that although a differential output device 202 is described herein, that a single driver stage and single output device may also be used according to the several embodiments of the invention. The differential output 208 may be subject to output variations because of temperature and beta variations.

In block 704, the differential output is replicated at a separate emitter 232 in a sensing device 228. The separate emitter 232 may be part of a dual emitter transistor 204 as described above, or may be in a separate transistor 242. The separate emitter 232 is in close proximity to the emitter 220 providing the output in the differential output device 202 so that the characteristics of the forward bias voltage of the separate emitter 232 are very similar to those of the emitter 220 providing the output.

In block 706, the replicated differential output is converted into a feedback signal. The process for converting the replicated output is described above. The feedback signal is a current that compensates for the variance in the forward bias voltage of the drive transistor.

In block 708, the feedback signal is applied to a node that influences or corrects the driver stage. The feedback signal may be applied at any of the three nodes 254, 256, or 258, as described above. The feedback signal is a current that can source or sink current, as necessary, to the transistors 204 and 206 to compensate for variations in the output voltage of the drive devices.

This invention has been described with reference to specific exemplary embodiments thereof. It will, however, be evident to persons having the benefit of this disclosure that various modifications may be made to these embodiments without departing from the broader spirit and scope of the invention. Specification and drawings are accordingly, to be regarded in an illustrative rather than in a restrictive sense.

What is claimed is:

1. A compensation circuit, comprising:
   a differential output device including a first emitter to provide a differential output;
   a sensing device disposed locally to the differential output device, the sensing device including a second emitter; and
   a feedback circuit coupled to the second emitter of the sensing device, the feedback circuit to generate a feedback signal to adjust the differential output and to apply the feedback signal to a node of a driver stage.

2. The compensation circuit of claim 1, wherein the sensing device is immediately adjacent to the differential output device.

3. The compensation circuit of claim 1, wherein the sensing device occupies a same process well as the differential output device to match a first current density of the sensing device and a second current density of the differential output device.

4. The compensation circuit of claim 1, further comprising a driver stage including an output coupled to a base of the differential output device.

5. The compensation circuit of claim 4,
   wherein the feedback circuit includes a first resistor having a first resistance coupled to a second base of the sensing device and a second resistor having a second resistance coupled to the second emitter of the sensing device; and
   wherein a common-emitter current gain is determined using the first resistance, the second resistance, a collector voltage of the differential output device, and a high voltage of the circuit.

6. The compensation circuit of claim 4, wherein the driver stage is a differential driver stage.

7. The compensation circuit of claim 6, wherein the driver stage comprises:
   a first driver stage including the output coupled to the base of the differential output device; and
   a second driver stage including a second output coupled to a second base of the differential output device.

8. The compensation circuit of claim 7, wherein the first emitter and the second emitter comprise a dual-emitter transistor.

9. The compensation circuit of claim 7, wherein the differential output device comprises a first transistor including the base and the first emitter and a second transistor including a third base and the sensing device comprises the second emitter in close proximity to the first transistor that provides feedback compensation to generate the feedback signal.

10. The compensation circuit of claim 9, wherein the base and the third base are both coupled to the output of the first driver stage.

11. The compensation circuit of claim 9, wherein the third base of the second transistor is coupled to a third resistor having a third resistance, and a collector of the second transistor is coupled to a fourth resistor having a fourth resistance.

12. The compensation circuit of claim 11, wherein the common emitter current gain is determined using the third resistance, the fourth resistance, the collector voltage of the differential output device, and the high voltage of the circuit.

13. The compensation circuit of claim 4, wherein the feedback signal comprises a compensating current applied to the driver stage.

14. The compensation circuit of claim 13, wherein the feedback signal is applied to an input of the driver stage.

15. The compensation circuit of claim 13, wherein the feedback signal is applied to the output of the driver stage.

16. The compensation circuit of claim 13, wherein the feedback signal is applied to a current source coupled to the driver stage.

17. The compensation circuit of claim 1, wherein the feedback signal adjusts the differential output to compensate for temperature changes.

18. The compensation circuit of claim 1, wherein the second emitter replicates the differential output of the first emitter.

19. The compensation circuit of claim 1, wherein a first orientation of the first emitter is different from a second orientation of the second emitter.

20. The compensation circuit of claim 1, including a low capacitance node to allow increased operating frequency.

21. A bandgap circuit comprising the compensation circuit of claim 1.

22. An input/output (I/O) circuit comprising the compensation circuit of claim 1.

23. A method for compensation of a circuit comprising:
sensing variations in at least one of temperature or common-emitter current gain in the circuit using a sensing device disposed locally to a differential output device; and
applying a feedback signal to a node of a driver stage to compensate for the variations, wherein the feedback signal is generated by a feedback circuit coupled to the sensing device.

24. The method of claim 23, wherein sensing the variations comprises:
generating a differential output using the differential output device at a first emitter;
replicating the differential output at a second emitter in the sensing device;
converting the replicated differential output at the second emitter into the feedback signal in the feedback circuit; and
applying the feedback signal to a driver stage that drives the differential output device.

25. The method of claim 24, further comprising applying the feedback signal at an output of the driver stage.

26. The method of claim 24, further comprising applying the feedback signal at a current source coupled to the driver stage.

27. The method of claim 24, further comprising applying the feedback signal at an input of the driver stage.

28. The method of claim 24, wherein converting the replicated differential output at the second emitter into the feedback signal in the feedback circuit comprises:
determining the common emitter current gain for the differential output device, wherein the feedback signal comprises a compensating current.

29. The method of claim 28, wherein determining the common emitter current gain comprises:
determining a first resistance of a first resistor in the feedback circuit coupled to the second emitter and a second resistance of a second resistor coupled to a base coupled to the second emitter;
determining the common emitter current gain using the first resistance, the second resistance, a collector voltage of the differential output device, and a high voltage of the circuit.

30. A compensation circuit, comprising:
means for compensating for at least one of temperature or common emitter current gain in a circuit using a sensing device disposed locally to a differential output device, wherein the means for compensating for at least one of temperature or common emitter current gain is incorporated into the differential output device; and
a driver stage including an output coupled to the differential output device;
wherein the means for compensating comprises:
means for detecting a variation of an output signal generated by the differential output device; and
means for correcting the output signal generated by the differential output device.

31. The compensation circuit of claim 30, wherein the means for correcting comprises:
means for applying a compensating current to the driver stage.

32. The compensation circuit of claim 30, wherein the means for correcting comprises:
means for applying a compensating voltage to the driver stage.

33. The compensation circuit of claim 30, wherein the sensing device is immediately adjacent to the differential output device.

* * * * *